United States Patent
Waller

(10) Patent No.: US 6,310,880 B1
(45) Date of Patent: Oct. 30, 2001

(54) CONTENT ADDRESSABLE MEMORY CELLS AND SYSTEMS AND DEVICES USING THE SAME

(75) Inventor: Craig Waller, Garland, TX (US)

(73) Assignee: Silicon Aquarius, Inc.

( * ) Notice: Subject to any disclaimer, the term of this patent is extended or adjusted under 35 U.S.C. 154(b) by 0 days.

(21) Appl. No.: 09/527,351

(22) Filed: Mar. 17, 2000

(51) Int. Cl.[7] ................................................. H04L 12/56
(52) U.S. Cl. ........................ 370/400; 370/401; 365/49; 365/189.07
(58) Field of Search ............................. 365/49, 189.07; 370/400, 401

(56) References Cited

U.S. PATENT DOCUMENTS

| 5,255,226 | 10/1993 | Ohno et al. ................... 365/189.12 |
| 5,390,173 | * 2/1995 | Spinney et al. .................. 370/60 |
| 5,642,320 | 6/1997 | Jang ................................. 365/222 |
| 5,724,296 | 3/1998 | Jang ................................. 365/222 |
| 5,949,696 | 9/1999 | Threewitt ............................ 365/49 |
| 5,999,435 | * 12/1999 | Henderson et al. ................ 365/49 |
| 6,108,227 | * 8/2000 | Voelkel ............................... 365/49 |

OTHER PUBLICATIONS

*Music Semiconductors—CAM Tutorial* Nov. 11, 1999 p. 1–4" Application Note AB–N6 What is a CAM?".

*IEEE Journal of Solid State Circuits* vol. SC–22 No. 1 Feb. 1987"Dynamic Cross Coupled . . . High Density Array" by Wade & Sodini, p. 119–121.

*Neocore Technical Documentation* Release 1.0 Sep. 28, 1999 by Liebman "Non–Technical Introduction to Pattern–Based Associative Processing" p. 1–6.

*Design Feature* Jun. 24, 1999 "Special–purpos SRAMs Smooth the Ride" pp. 93–104.

*Tech Insights* Electronics Designs Jun. 28, 1999 "Speedy Flash–Based FPGA's Scope with 500–Kgote Density" by Bursby, Dave pp. 36–40.

* cited by examiner

Primary Examiner—Son Mai
(74) Attorney, Agent, or Firm—James J. Murphy, Esq.

(57) ABSTRACT

A content addressable memory cell 920 includes a first storage element 922a for storing information and a first transistor 921a for selectively transferring charge representing information from a first bitline 924a to the first storage element 922a. A second transistor 921b selectively transfers charge representing information from a second bitline 924b to a second storage element 922b. First and second comparelines 925a, 925b carry first and second bits of a comparand to a comparator 905, 906, 908 which compares the first and second bits of the comparand with information stored on the first and second storage elements. In response, comparator 905, 906, 908 selectively controls a voltage on a corresponding one of a plurality of matchline 909.

6 Claims, 9 Drawing Sheets

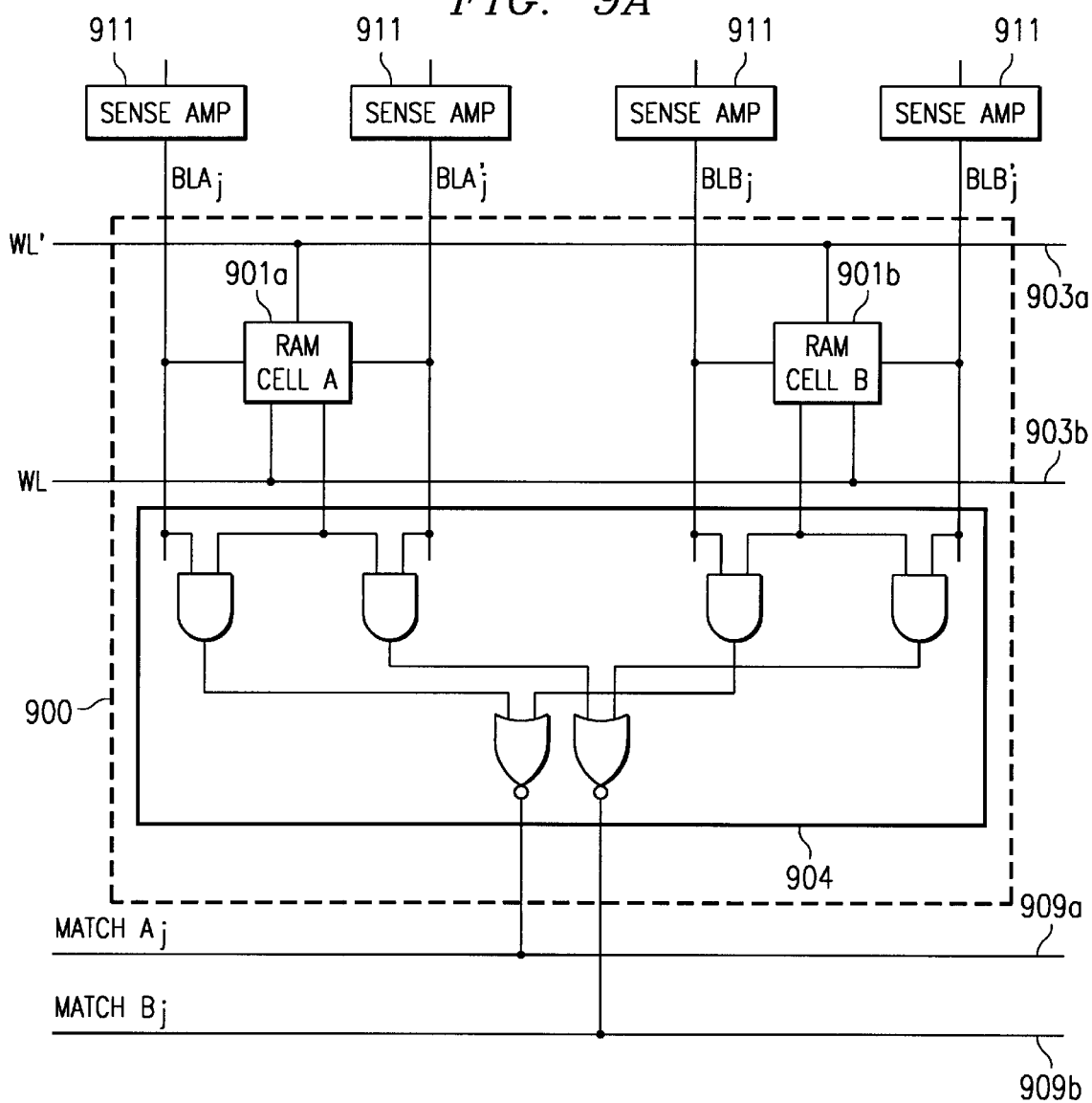

CONTENT ADDRESSABLE MEMORY CELLS AND SYSTEMS AND DEVICES USING THE SAME

FIELD OF THE INVENTION

The present invention relates in general to electronic memories and in particular to content addressable memory cells and systems and devices using the same.

DESCRIPTION OF THE RELATED ART

Background of the Invention

The most prevalent type of memory in data processing and telecommunications applications is the random access memory (RAM). In a RAM, the memory cells are organized in an array of addressable locations, where each location is comprised of one or more cells each storing a bit of data. During a random access, data are associated with an address and the corresponding location in the array accessed (read from or written to). During burst and page accesses, multiple words of data are stored or retrieved from a commonly addressable set of locations in the array, such as those along a single row when the array is organized in rows and columns.

Random access memories are not ideal in a number of situations. For example, to search for data stored within RAM, a sequence of addresses must be generated and data from the accessed locations sequentially examined until the search is complete. Typically, there is no guarantee that the data will be found within a predetermined number of access cycles, or even that the data will be found at all. This procedure is inefficient in applications such as networking, ATM (asynchronous transfer mode) switching, voice and image recognition, where time constraints on searching are critical.

As a result of the deficiencies of conventional RAM devices, the content addressable memory (CAM) was developed. The CAM is a data associative memory in which data is broadcast to all locations in the cell array at once. A comparison is made in each location between a received piece of data and the data stored in the cells of that location. When a match occurs, a flag is set to an active state based on the associated "matchline". The output at the match lines can then be used as data for further processing. For example, the match line output may represent an address in RAM associated with a search target.

Content addressable memories can be either static or dynamic. The static design is very similar to a static RAM (SRAM) cell, essentially acting as a latch to store each bit of data. The Dynamic CAM, similar to a dynamic RAM, stores data as charge on a capacitor, although charge leakage from the capacitor will cause data deterioration and even loss if left unchecked. Consequently, with dynamic CAMs, the charge on the storage data in the cell capacitors must be periodically refreshed. In conventional dynamic CAMs, time must be taken for cell refresh, generally during which no data accesses can be made to the array.

Another problem with conventional dynamic CAMs arises from the fact that during a data access or refresh to the array, match operations cannot normally be performed. This is particularly true with regards to those columns of locations to which data are being read or written during update of the search database. As a result, CAM performance cannot be optimized.

What are needed therefore are CAM cell structures and device architectures which allow simultaneous updates of the stored database while match operations are being performed. Additionally, in the case of dynamic cells, such cells and architectures should retain the reduced power consumption advantage reduced die area a dynamic device provides but appear as a static CAM to an external processing device.

SUMMARY OF THE INVENTION

According to one embodiment of the principles of the present invention, a content addressable memory cell is disclosed which includes a first and second storage elements along with first and second transistors for selectively transferring charge between corresponding first and second bitlines and the first and second storage elements. The content addressable memory cell further includes first and second comparelines, each for carrying a corresponding bit of a comparand. A comparator 402 compares first and second bits of the comparand presented on the comparelines with information stored on the first and second storage elements and selectively controls a voltage on a corresponding one of a plurality of matchlines in response.

According to another embodiment of the principles of the present invention, a content addressable memory cell is disclosed which includes first and second pairs of bitlines, along with first and second memory cells. Each memory cell includes a first transistor for coupling the data storage node of that cell to either one of the first pair of bitlines or one of the second pair of bitlines as selected by a signal presented on a corresponding one of first and second wordlines. The memory cell is further associated with a plurality of matchlines for carrying the results of multiple comparisons made against the information stored in the memory cells. Comparator circuitry compares data stored at the first storage node with data presented on a first compareline and data stored at the second storage node with data presented on second compareline and selectively pulls down a precharged matchline in response.

According to an additional embodiment of the principles of the present invention, a multiple matchline content addressable memory is disclosed. This content addressable memory includes a plurality of conductors and a plurality of memory cells, each cell comprising a storage element and a transistor for selectively coupling the storage element to a corresponding one of the plurality of conductors. A plurality of comparator circuits are included, each for comparing a bit of data stored in the storage element of a selected one of the memory cells with a bit of a comparand presented on a corresponding one of the plurality of conductors and selectively controlling an associated one of a plurality of matchlines in response.

The principles of the present invention are also embodied in a telecommunications subsystem including a plurality of input ports for a receiving stream of information and a plurality of output ports, a selected one of the output ports transmitting the stream of information received by the input port to a next node in a telecommunications network. A content addressable memory stores a translation table, the translation table containing information for selecting the selected one of the output ports and includes a plurality of conductors, a plurality of memory cells and comparator circuitry for comparing data presented on a selected one of the plurality of conductors with data stored on storage elements of a corresponding pair of memory cells. In response to the comparison, the comparator circuitry selectively pulls down a voltage on an associated matchline.

The principles of the present invention allow for the construction of and operation of content addressable memory cells with multiple comparelines and/or multiple matchlines. Moreover, in some embodiments, two pairs of bitlines are provided such that one set of bitlines can be used to access the storage elements of the memory cells while the second set of bitlines is being precharged. They are advantageously used for simultaneous updates of the stored data base while match operations are being performed. At the same time, multiple comparelines and matchlines allow for multiple comparisons to be made against multiple comparand bits simultaneously.

BRIEF DESCRIPTION OF THE DRAWINGS

For a more complete understanding of the present invention, and the advantages thereof, reference is now made to the following descriptions taken in conjunction with the accompanying drawings, in which:

FIG. 9A is a functional block diagram, and

DESCRIPTION OF THE PREFERRED EMBODIMENTS

The principles of the present invention and their advantages are best understood by referring to the illustrated embodiment depicted in FIGS. 1–9C of the drawings, in which like numbers designate like parts.

Figure 1:
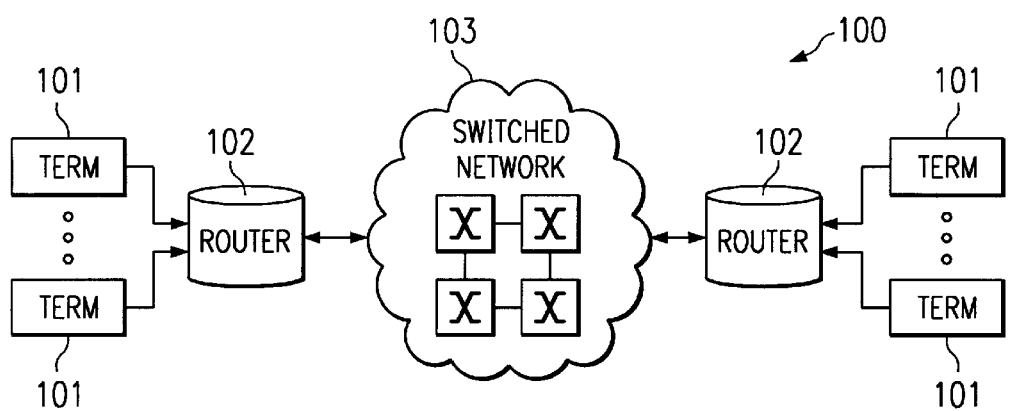
FIG. 1 is a high level functional block diagram of the major subsystems of an ATM network.

FIG. 1 is a high level functional block diagram of the major subsystems of an ATM network 100. In the illustrated network, raw data packets are generated, for instance in the Internet Protocol (IP), by a selected terminal 101 and sent to a router 102. In routers 102, routing tables, maintained by routing algorithms, contain route information which allow an optimum route to be chosen for the "next hop" through network 100 for a given packet. Specifically, when a cell arrives at a router 102, the router checks the destination address in the packet and associates that address with a path to the next node along the path using the routing table.

The packetized data are sent to an ATM interface in the source router 102. The interface segments the IP packets into ATM cells. A standard ATM cell is 53 bytes long, with the first 5 bytes being the header and the following 48 bytes being the payload. The header includes fields for flow control, virtual path and virtual channel identifiers, a payload type identifier, a congestion loss priority assignment and a header checksum value. The payload bytes contain the user data itself (voice, video or data), along with possible adaptation layer information.

For each ATM node the virtual channel identifier (VCI) and the virtual path identifier (VPI) are setup which define a virtual circuit with the next node in the network. Since the corresponding virtual path and virtual channel are valid only for the local point-to-point connection, they will be typically remapped at the destination switches after each switching function. Moreover, since each node must establish a separate connection with each of the other nodes communicating with it, an operator configured permanent virtual circuit (PVC) or switched virtual circuit (SVC), set up by the ATM signaling protocol, are used to effectuate communications between endpoints 101.

ATM switches 103 receive cells along with their virtual channel and virtual path identifiers and compares those identifiers with a set of identifiers stored in a translation table in accordance with a switching table. From the comparison, the switch outgoing ports are identified and the virtual channel and virtual path identifiers remapped as required to transmit each cell on its next hop.

Implementation of the translation (routing) tables in routers 102 and switches 103 is a critical factor in network design. In the past, address translation was performed by relatively slow hardware and software search engines. As lower cost CAMs are developed, these search engines can be replaced by CAM arrays. However, as previously discussed, conventional CAMs are still subject to serious disadvantages, including cost and power consumption.

Figure 2:
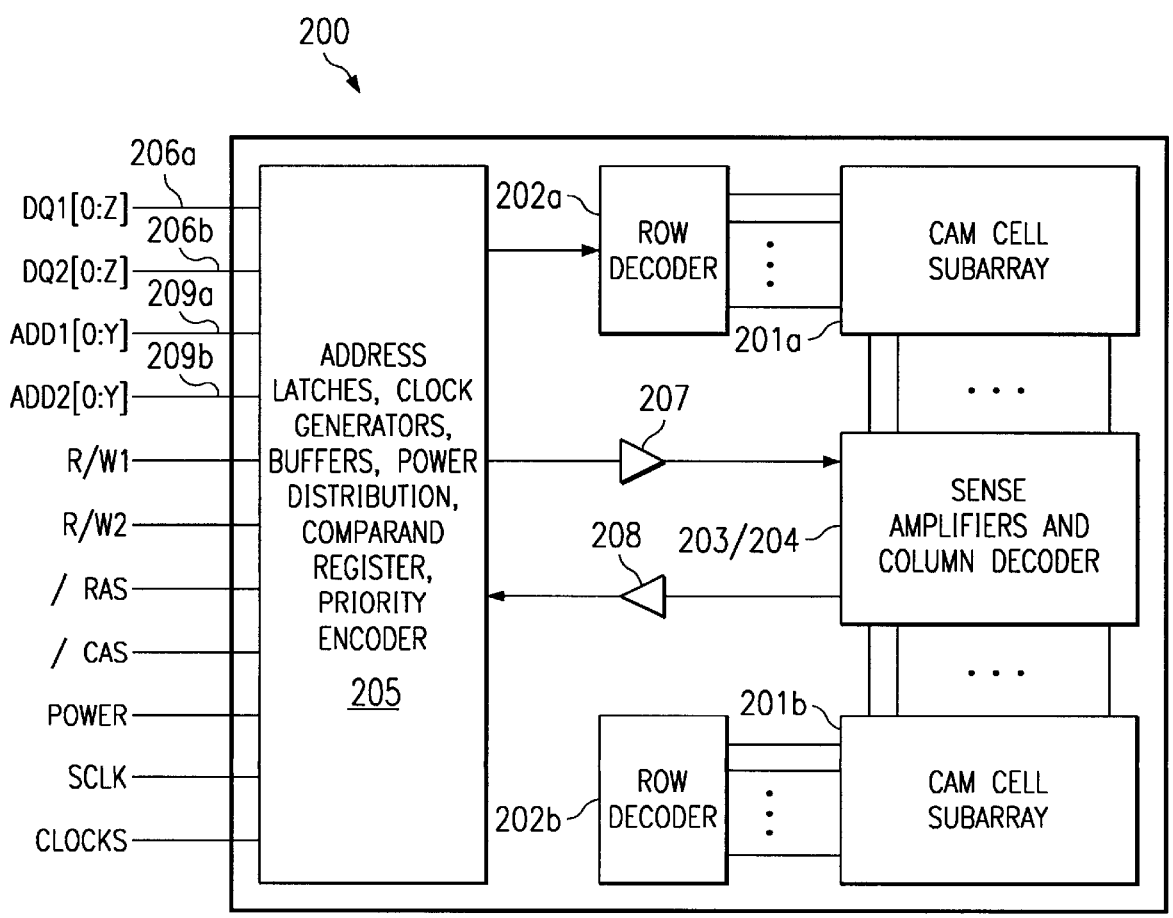
FIG. 2 is a high level block diagram of a content addressable memory (CAM) device or subsystem.

FIG. 2 is a high level block diagram of a content addressable memory subsystem 200, preferably fabricated on a single integrated circuit chip. This figure illustrates an embodiment with two DRAM I/O ports, suitable for supporting CAM cells based on 2T, 1C DRAM cells, for discussion purposes. As will become apparent from the following discussion, the use of two DRAM I/O ports is not required to practice the principles of the present invention and therefore, in alternate embodiments, these ports may be replaced with, among other things, a single DRAM I/O port or one or more SRAM-type ports.

Memory 200 includes a pair of subarrays 201a and 201b, each composed of rows and columns of CAM cells and collectively forming an array 201. In the two port embodiment, each row of cells is associated with a pair of conductive wordlines and each column of cells is associated with a pair of conductive DRAM-bitlines. According to the inventive concepts, each location is further associated with at least one matchline and each column is associated with a pair of comparelines. This structure will be discussed in detail below.

Generally however, during an access (read or write), a row of cells in array 201 is selected in response to a received row address by either row decoder 202a or 202b, which activates one of the pair of the conductive wordlines coupled to the cells of the selected row. Data is input to or output from each cell along the row through one of the DRAM-bitlines associated with the corresponding column (at the same time the other bitline for that column can be put into precharge).

During a read, the data from the entire active row of cells are sensed and latched by sense amplifiers 203. The bitline—sense amplifier layout can be either an open or folded bitline arrangement. During a read, column decoder 204, in response to a received column address(es), selectively passes desired data (e.g. in bits, bytes or words) from sense amplifiers 203 from the appropriate locations along the active row. During a write, data are transferred to the proper cells along the active row directly through column decoder 204 (data in sense amplifiers 203 are essentially written over).

During a compare, a comparand stored within a Comparand Register (block 205), is compared against all the locations in the array, wherein a location comprises one or more cells along a row. The width of the data storage locations, and hence the width of the comparand will vary from application to application. Generally, the data in the Comparand Register is presented on the comparelines in the entire array. The precharged matchlines of those locations storing matching data are maintained high while the matchline of those locations storing non-matching data are pulled down. A Priority Encoder resolves instances of multiple matching locations.

In the illustrated embodiment, the data passed by column decoder 204 are selectively input to or output from device 200 through two Z-bit wide input/output (I/O) ports 206a (DQ1[0:Z]) and 206b (DQ2[0:Z]). Data being output (read) from memory 200 are driven by a set of read amplifiers 207. During a write, write buffers 208 drive received data from the given I/O port through the column decoder (which selects the bitlines of the cells to be written) and the sense amplifiers to array 201. While two I/O ports 206 are shown for illustration, in some embodiments only one such port is provided. In these cases, the single data I/O port 206, and/or the external data, is multiplexed. As will become apparent, data ports 206 can be multiplexed such that one set of bitlines can be accessed during one cycle and a second set accessed during the immediately following cycle.

For the dual DRAM-type I/O, block 206 also generally shows the traditional input/output circuitry, including buffers address latches, power distribution circuitry and clock generation circuitry. In the illustrated embodiment, at least one multiplexed address bus is coupled to an Y-bit wide address port 209 (ADD[0:Y]) from which row addresses are latched-in with the row address strobe (/RAS) and column addresses with the column address strobe (/CAS). It should be noted that two address ports, 209a and 209b, as shown in FIG. 2, may be used such that two data ports (DQ) can be independently controlled and/or a single data I/O port controlled by two processors. (/RAS also controls the timing of bitline precharge and sense amplifier set-up; one bitline of each column is precharged and its sense amplifier set-up during the high periods of /RAS and the other bitline precharged and its sense amplifier set-up during the low periods of /RAS.)

Read/write signals R/W1 and R/W2 control the reading and writing of data to and from data ports 206a and 206b respectively. If a single port 206 is provided, then only a single read/write signal is necessary.

As briefly indicated above, the Comparand Register is also disposed within circuit block 205 for temporarily storing the comparand being compared with the data stored in the array. Also included within block 209 is the Priority Encoder which resolves occurrences of multiple-matches between the comparand and the data stored within the locations of the array.

Figure 3:
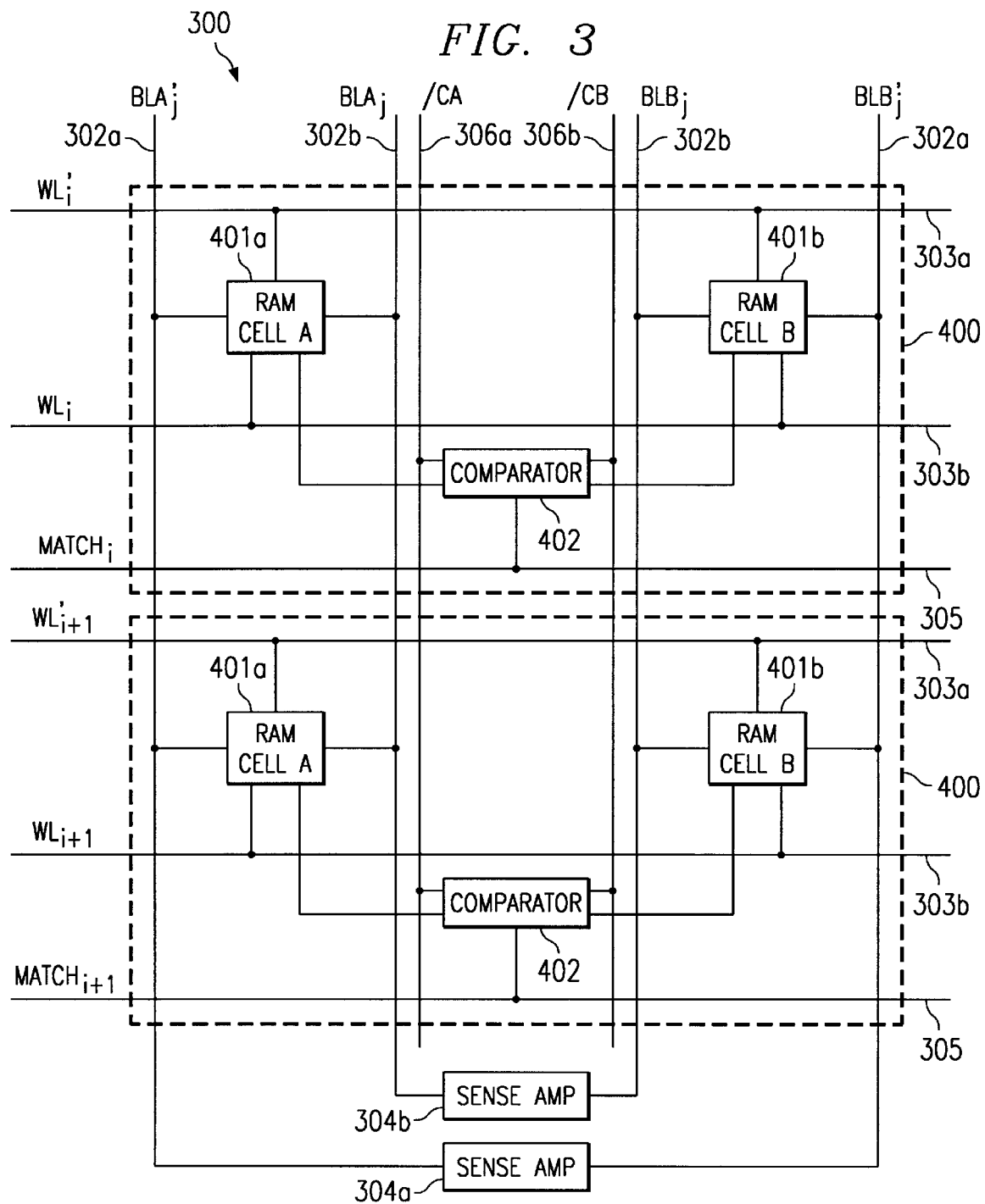
FIG. 3 is a more detailed diagram showing the bitline/wordline/matchline architecture of a very small portion of a CAM subarray and the corresponding sense amplifiers.

FIG. 3 is a more detailed diagram showing the bitline/wordline/matchline architecture of a very small portion of a selected subarray 201a or 201b, along with corresponding sense amplifiers 203. Two selected ternary CAM cells are shown as logic blocks generally at 400 and will be discussed in detail in conjunction with FIG. 4.

The two exemplary binary CAM cells shown in FIG. 3 are taken from two exemplary rows (Rows i and i+1) and along one selected column (Column j) of an m row by n column subarray. In actual implementation the number of rows and columns will be much larger; the array could be, for example, 1024 rows by 1024 columns (i.e. m=n=1024) or larger.

In the illustrated embodiment of FIG. 3, a folded bitline arrangement is shown. Each cell 400 in each column of a given subarray 201 is coupled to two pairs of DRAM half-bitlines 302a and 302b. Half-bitlines $BL_jA'$ and $BL_jB'$ (302a) share a sense amplifier 304a and half-bitlines $BL_jA$ or $BL_jB$, (302b) share a sense amplifier 304b, where j is the column number between 0 and n−1. Each row of cells is coupled to a pair of wordlines 303a and 303b ($WL'_i$ and $WL_i$, where i is the row number between 0 and m−1).

For a given set or location of cells 400, a CAM matchline (Match$_i$) 305 is provided. For clarity of discussion, assume that each location is equal to the length of one row, although location width will change from embodiment to embodiment. The matchlines are coupled to the Priority Encoder in block 205. Each column is further associated with a pair of comparelines /CA$_j$ and /CB$_j$ (306a and 306b, respectively), which are coupled to the Comparand Register in Block 205.

Figure 4:
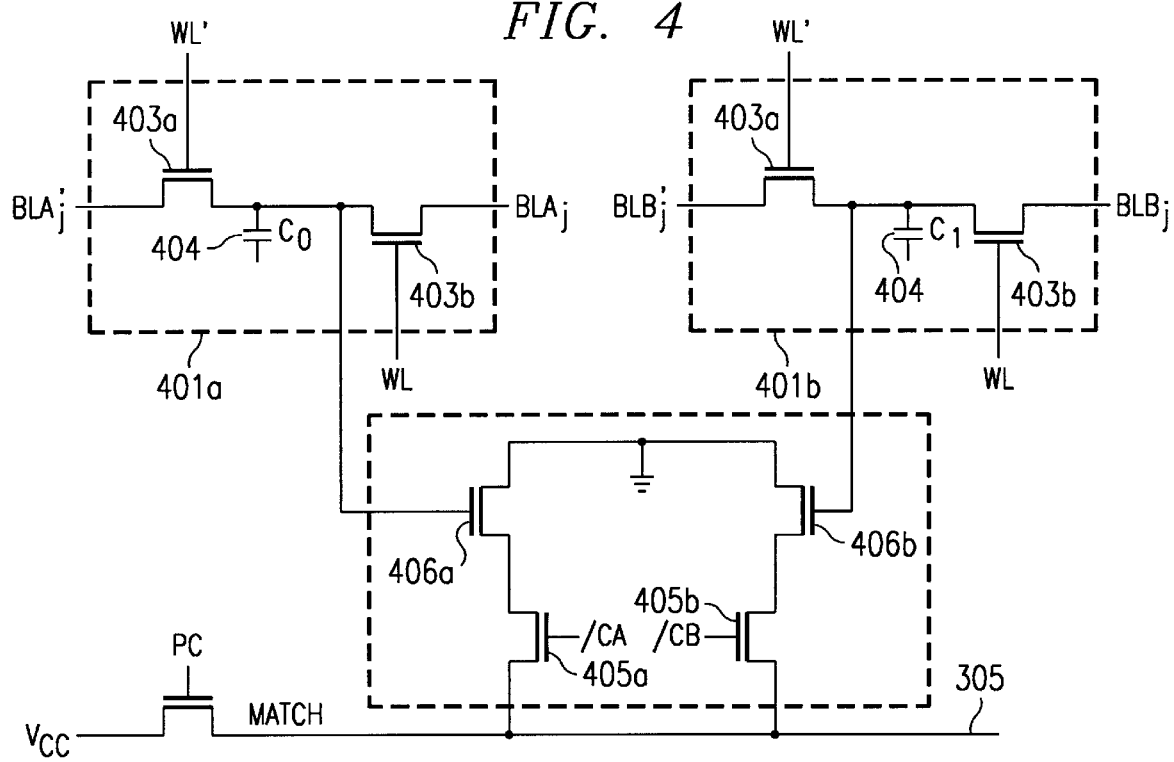
FIG. 4. is an electrical schematic diagram of a selected one of the memory cells of FIG. 3.

FIG. 4 is an electrical schematic diagram of a ternary CAM cell 400 based on a pair of two-transistor, one-capacitor (2T1C) dynamic random access memory (DRAM cells) 401a and 401b and an exclusive-NOR (XNOR) gate comparator 402. Each 2T1C DRAM cell includes a pair of pass transistors 403a and 403b and a data storage capacitor 404. The gates of pass transistors 403a of each cell 401 are coupled to wordline $WL'_i$ of the corresponding row and the gates of pass transistors 403b of each cell 401 are coupled to wordline $WL_i$ of that row. XNOR gate 402 in the illustrated embodiment is comprised of a pair of transistors 405a and 405b which are coupled in series with the corresponding matchline 305 and have gates coupled to comparelines /CA$_j$ and /CB$_j$ respectively for the associated column. In turn, transistors 406a and 406b are coupled in series between transistors 405a and 405b and ground and have gates coupled to capacitive storage nodes $C_0$ and $C_1$ respectively.

Advantageously, an access (read or write) and a match operation can be performed simultaneously, interleaved or asynchronously to cell 400. Additionally, while one DRAM half-bitline pair is being used for the access, the other DRAM half-bitline pair can be put into precharge and prepared for the next access to the cell. Moreover, an access can be made to one row in the array while a data refresh is being performed to another row since two wordlines and two pairs of DRAM half-bitlines are provided. Advantageously, address translations and similar comparison-based operations can be performed without having to halt for reads, writes, refreshes nor slowed by DRAM-bitline precharge.

Figure 5:
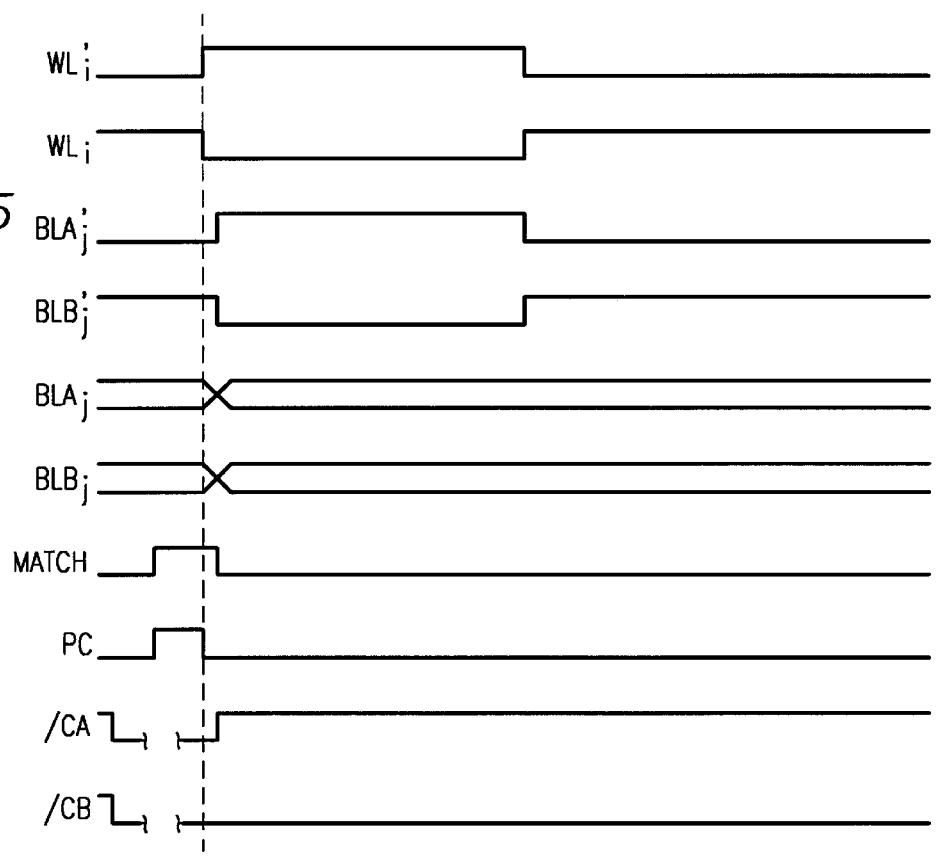
FIG. 5 is a timing diagram illustrating a simultaneous compare and access operations using the cell of FIG. 4.

An example of simultaneous compare and access operations to the binary CAM embodiment of FIG. 3, is illustrated in FIG. 5. It should be noted that the compare operation is performed to all cells (locations) within the array while the access is being made to a row selected by the incoming row address.

Prior to the compare operation, the compareline /CA and /CB are brought to a logic low voltage and all current paths to $V_{ss}$ turned off. Then the signal PC is brought to an active logic high state such that all matchlines in the array are precharged. The PC signal then transitions to a logic low voltage and the matchlines allowed to float. The array is now in condition for comparison operations.

For discussion purposes, consider the case of a single one-cell storage location along Row i and Column j. Also assume that the access is a refresh or read operation and that the bits on capacitors $C_0$ and $C_1$ are respectively a logic 1 and a logic 0. In this example, an active voltage is asserted on wordline $WL'_i$, an inactive voltage is presented on wordline $WL_i$. The data on half-bitlines $BLA_j'$ and $BLB_j'$ for all the columns in the array are sensed and latched by sense amplifiers 304a. For a read, column addresses are generated and data paged out from the sense amplifiers. For a refresh no I/O is performed; the sense amplifiers are simply allowed to restore the stored data to their full voltage levels. At the same time, bitlines $BLA_j$ and $BLB_j$ are precharged and equalized in preparation for the next access to the array.

For a binary compare, a bit of data and its complement from the Comparand Register are presented on the comparelines $/CA_j$ and $/CB_j$ for all the columns of the array. As a result, the comparand is compared with the data stored in all single-bit locations within the array. Referring again to the example of FIG. 5, and the cell shown in FIG. 4, assume that match bitline $/CA^j$ carries a logic high voltage and $/CB_j$ a logic low voltage. In this state, transistor 405a turns on and transistor 405b turns off. In response to the charge at capacitive nodes $C_0$ and $C_1$ transistors 406a and 406b are respectively in the turned-on and turned-off states, and therefore the corresponding matchline is pulled down from the precharged (logic high) state. This conforms to a match between the stored data and /CA and /CB which translates into "No Match" for the complementary comparand.

It should be noted that in the following discussion a "masked" state is described. Here, both the comparelines are set to zero such that the given cell always reads out a Logic High (float) state on its matchline(s).

A complete truth table describing the operation of binary CAM 300 in FIG. 3 is provided in Table 1.

TABLE 1

| /CA | /CB | $C_0$ | $C_1$ | MATCH |
| --- | --- | --- | --- | --- |
| 0 | 0 | X | X | FLOAT/MASKED |
| 1 | 0 | 1 | 0 | GND/NO MATCH |
| 1 | 0 | 0 | 1 | FLOAT/MATCH |
| 0 | 1 | 1 | 0 | FLOAT/MATCH |
| 0 | 1 | 0 | 1 | GND/NO MATCH |

X = don't care

Figure 6:
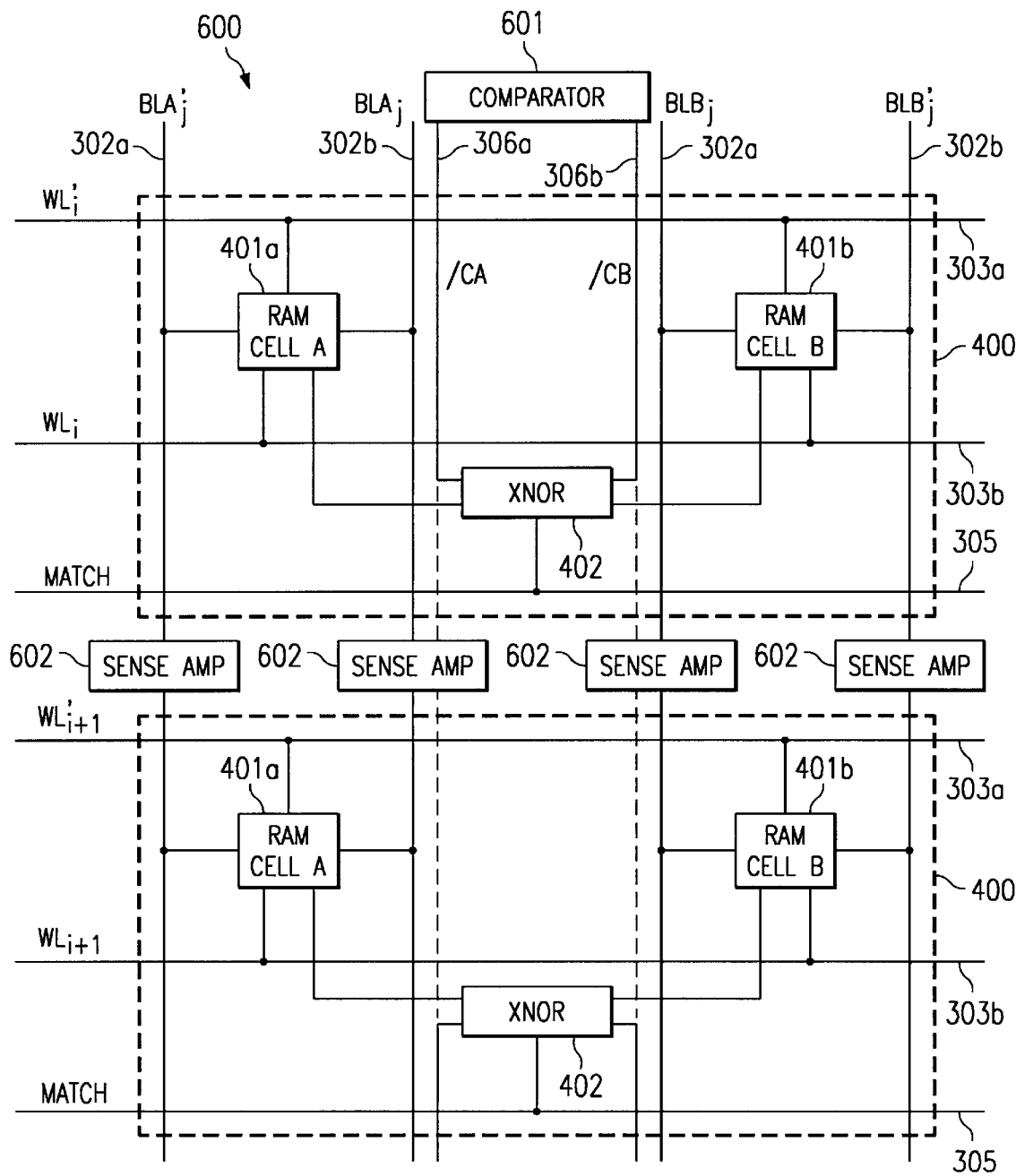
FIG. 6 illustrates a ternary embodiment using 2T1C DRAM cells.

A ternary embodiment 600 using 2T1C DRAM cells 400 is shown in FIG. 6. In this case, each column of cells is associated with a comparator 601 coupled to the XNOR gates 402. Each bitline BL'$x_i$ and BL$x_i$ (where x is a placeholder for A or B in this example) for each cell is coupled to a separate sense amplifier 602. The structure of cells 400 otherwise remains the same. In this example, both cells can be independently programmed as a result of the independent sense amplifier structure. The operation of ternary memory 600 is illustrated in Table 2.

TABLE 2

| /CA | /CB | $C_0$ | $C_1$ | MATCH |
| --- | --- | --- | --- | --- |
| 0 | 0 | 0 | 0 | FLOAT (MASKED DON'T CARE) |
| 0 | 0 | 1 | 0 | FLOAT (MASKED) |
| 0 | 0 | 0 | 1 | FLOAT (MASKED) |
| 1 | 0 | 0 | 0 | FLOAT (DON'T CARE) |
| 1 | 0 | 1 | 0 | GND (NO MATCH) |
| 1 | 0 | 0 | 1 | FLOAT (MATCH) |
| 0 | 1 | 0 | 0 | FLOAT (DON'T CARE) |
| 0 | 1 | 1 | 0 | FLOAT (MATCH) |
| 0 | 1 | 0 | 1 | GND (NO MATCH) |

It should be noted that a stored "00" represents a Don't Care state, while the input stored "11" state is not shown it can be easily understood that is will only result in a match if a mask is presented on the comparelines.

With regards to the operation of the ternary device of FIG. 6, the following should be noted. Again, the comparelines are held low while the matchlines are charged. At the same time at least one set of bitlines (BL or BL') can be precharged while another set is used to sense and restore the data stored in the cells of the array. Once the data in the memory cells is valid (i.e., the sense and restore is complete) the comparelines can then be driven with the comparand and the compare performed. The given wordline WL or WL' used for the sense and restore can remain active (open) during the start of the comparison as long as the restoring sense amplifiers 602 have already latched the data to their full values.

The inventive concept of the dedicated compareline CAM cell described above can be embodied in a number of other CAM architecture. A selected few of these can be described as follows, although these examples are not exhaustive.

Figure 7A:
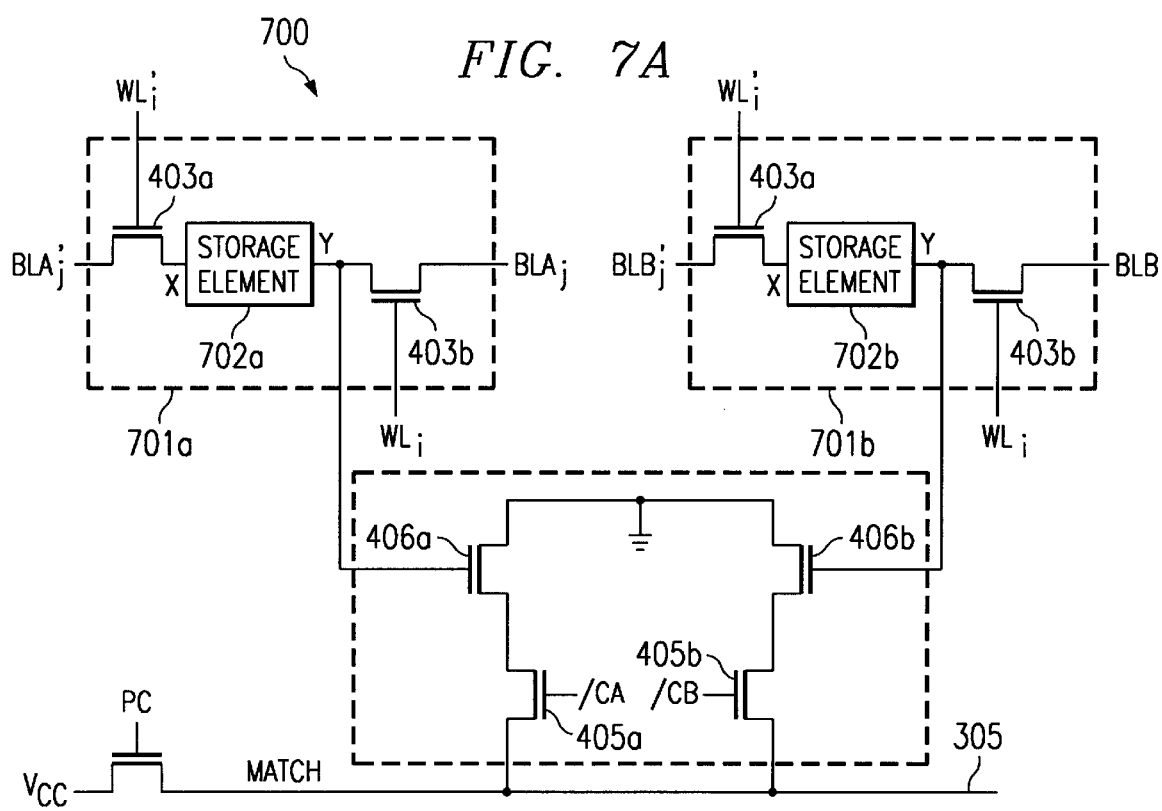
FIG. 7A illustrates a more generalized version of the CAM cell described in FIG. 4.
Figure 7B:
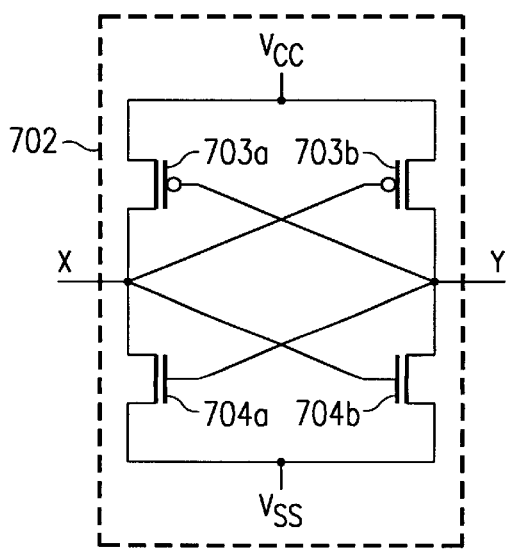
FIG. 7B illustrates one example of an SRAM cell suitable for use as a storage element in embodiments of the inventive content addressable memory cells.

FIG. 7A illustrates a more generalized version of the CAM cell described in FIG. 4. In this case, a pair of memory cells 701a and 701b are based upon a general storage element 702a. (FIG. 4 describes a specific embodiment in which the storage element is a capacitor). Storage element can be any type of storage element, such as a latch or SRAM cell, a volatile memory cell, or even a non-volatile storage element, disposed between nodes X and Y of a given storage cell 701 in FIG. 7A. One example of an SRAM cell suitable for this purpose is shown in FIG. 7B, constructed from a pair of cross-coupled p-channel transistors 703 and n-channel transistors 704. Nodes X and Y in FIG. 7B correspond to a pair of nodes X and Y shown in FIG. 7A.

Figure 7C:
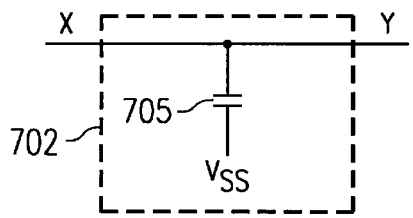
FIGS. 7C and 7D illustrate examples of a 1T-1C DRAM cell storage element and another SRAM configuration with nodes X and Y again corresponding to nodes X and Y shown in the higher level drawings.
Figure 7D:
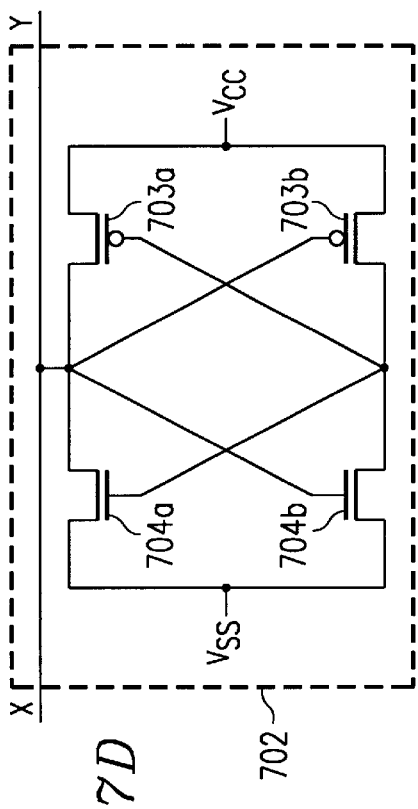

A 1T-1C DRAM cell storage element and a second SRAM configuration are shown in FIGS. 7C and 7D respectively, with nodes X and Y again corresponding to nodes X and Y shown in the higher level drawings.

Figure 8:
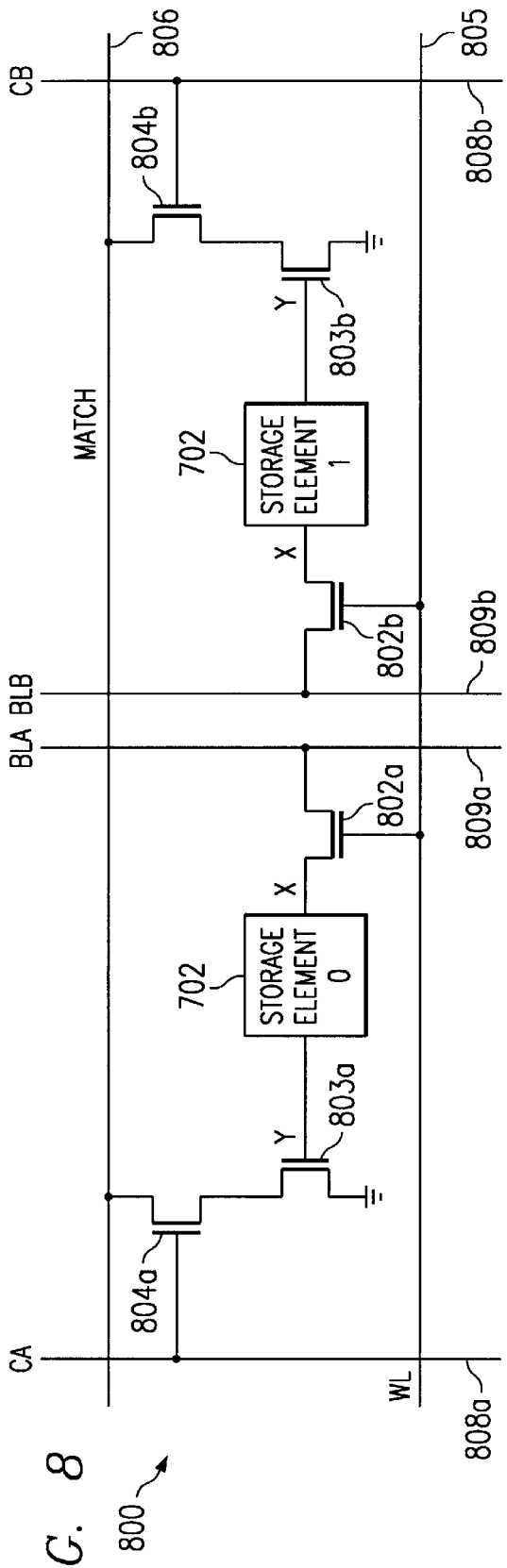
FIG. 8 depicts a ternary CAM cell embodiment based on single-transistor, single-storage element memory cells.

FIG. 8 depicts a ternary CAM cell embodiment 800 based on single-transistor, single-storage element memory cells. Specifically, each memory cell includes a storage element 702 and an associated pass transistor 802. The storage elements could be for example an SRAM cell such as that shown in FIG. 7A, with nodes X and Y corresponding between figures. The comparator again is an exclusive-NOR gate comprised of transistors 803 and 804, although this in not the only type of comparator which can be used. This embodiment operates from a single wordline 805 and a single matchline 806 per row. The XNOR gate inputs are coupled to a corresponding pair of true-logic bitlines CA and CB 808 and data is written to and read from the storage elements through a pair of complementary bitlines 809 coupled through a sense amplifier 811.

The operation of CAM cell 800 can be described in conjunction with Table 3.

TABLE 3

| CA | CB | Storage Element 0 (Node y) | Storage Element 1 (Node Y) | Match |
|---|---|---|---|---|
| 0 | 0 | 1 | 0 | Float (Masked) |
| 0 | 1 | 1 | 0 | Float (Match) |
| 1 | 0 | 1 | 0 | GND (No Match) |
| 1 | 1 | 1 | 0 | GND (No Match) |
| 0 | 0 | 0 | 1 | Float (Masked) |
| 0 | 1 | 0 | 1 | GND (No Match) |
| 1 | 0 | 0 | 1 | Float (Match) |
| 1 | 1 | 0 | 1 | GND (No Match) |
| 0 | 0 | 0 | 0 | Float (Don't Care) |
| 0 | 1 | 0 | 0 | Float (Don't Care) |
| 1 | 0 | 0 | 0 | Float (Don't Care) |
| 1 | 1 | 0 | 0 | Float (Don't Care) |

In interpreting Table 3, it should be noted that a Logic Zero is represented by a 0 in Storage Element 0 and a 1 in Storage Element 1. When the storage element is an SRAM cell, data are referenced from Node Y, with Nodes X holding the complement of the data. is an SRAM cell, data are referenced from Node Y, with Nodes X holding the complement of the data (hence the use of CA and CB in the logic formulation).

Figure 9B:
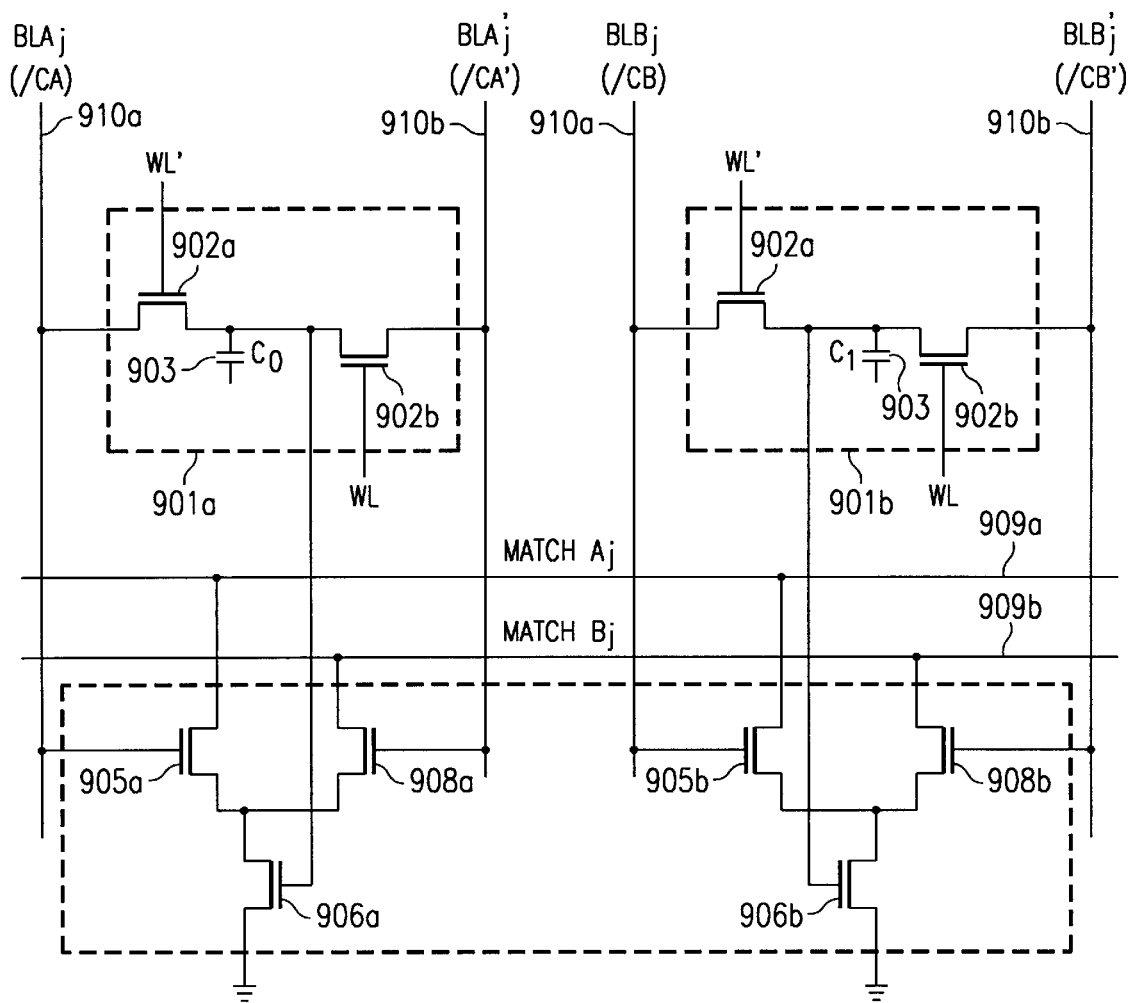
FIG. 9B is an electrical schematic diagram, of a multiple matchline CAM cell embodying the principles of the present invention.

FIG. 9A is a functional block diagram, and FIG. 9B is a corresponding electrical schematic diagram, of a multiple matchline CAM cell embodying the principles of the present invention. Here, a CAM cell 900 is depicted based on a pair of 2T1C cells 901 each comprised of a pair of pass transistors 902a and 902b and a storage capacitor 903. (Alternatively, another type of storage element can be used, as previously discussed). The gates of transistors 902a of row i are controlled by wordline WL'$_i$ 903a and the gates of transistors 902b by wordline WL$_i$ 903b. The cell comparator 904 also includes a pair of XNOR gates, the first of which is comprised of transistors 905a, 905b, 906a and 906b and the second of which is comprised of transistors 908a, 908b, 906a and 906b. The XNOR gates selectively pull down a corresponding pair of matchlines 909a and 909b, also labeled Match Aj and Match Bj, respectively.

Each 2T1C cell of column j is coupled to a pair of half-bitlines 910a and 910b, respectively labeled BLx$_j$ and BLx$_j$', and are coupled to their associated sense amplifiers 911 as shown in partial array depiction of FIG. 9A. FIG. 9A also provides a logical description of the XNOR functions of cell 900. In this embodiment, bitlines BLx and BLx', are dual-function thereby also serving as the compare lines /Cx and /Cx'. Specifically, compare lines /CA and /CB form a pair and compare lines /CA' and /CB' form a pair. It should be noted however, that independent compare lines such as those described above may also be employed in alternate embodiments.

The multiple-matchline embodiments of the present invention have the substantial advantage of allowing multiple comparisons to be performed simultaneously. Specifically, comparelines /CA and /CB allow a comparison with the stored data at nodes $C_0$ and $C_1$ with the result presented on matchline MATCHA$_j$ while comparelines /CA' and /CB' allow a similar comparison with the corresponding result presented on matchline MATCHB$_j$. The decoding is the same and is illustrated in TABLE 4. In Table 4, $C_0=0$, $C_1=1$ is interpreted as a Logic 0, $C_0=1$, $C_1=0$ as a Logic 1, and $C_0=C_1=0$ as don't care.

TABLE 4

| /CA (/CA') | /CB (/CB') | $C_0$ | $C_1$ | MATCH A (MATCH B) |
|---|---|---|---|---|
| 0 | 0 | 0 | 1 | FLOAT (MASKED) |
| 0 | 1 | 0 | 1 | GND (NO MATCH) |
| 1 | 0 | 0 | 1 | FLOAT (MATCH) |
| 0 | 0 | 1 | 0 | FLOAT (MASKED) |
| 0 | 1 | 1 | 0 | FLOAT (MATCH) |
| 1 | 0 | 1 | 0 | GND (NO MATCH) |
| 0 | 0 | 0 | 0 | FLOAT (DON'T CARE/MASK) |
| 0 | 1 | 0 | 0 | FLOAT (DON'T CARE) |
| 1 | 0 | 0 | 0 | FLOAT (DON'T CARE) |

For discussion purposes, consider the case where capacitor $C_0$ has been charged to a logic high voltage and capacitor $C_1$ to a logic low voltage. It should be noted that data can be written to capacitors $C_0$ or $C_1$ from either bitlines BLx or BLx', with the remaining set of half-bitlines transparently precharged.

Further, assume a logic high voltage is asserted on compare line /CA from the Comparand Register and a logic low voltage is asserted on compare line /CB. The data on compare lines /CA and /CB effectuate the first comparison. At the same time, a logic low voltage is presented on compare line /CA' and a logic high voltage on compare line /CB'. The data on these compare lines effectuate the second comparison.

With regard to the first comparison, transistor 905a turns-on, transistor 905b turns-off and transistor 906a turns-on. As a result, match line Match A is pulled down indicating that the true data in the Comparand Register does not match the data stored in cell 900 (i.e. the complementary data matches the stored data). The complementary data can match if the stored value is "don't care" 0,0.

With regards to the second comparison represented by the complement of the primed (') data from the Comparand Register, the following takes place. Transistor 908a is in the off state, transistor 908b is in the on state and transistor 906b is turned-off. As a result, match line Match B remains floating in its logic high precharged state. Relative to the true data in the Comparand Register, a match has been found.

Figure 9C:
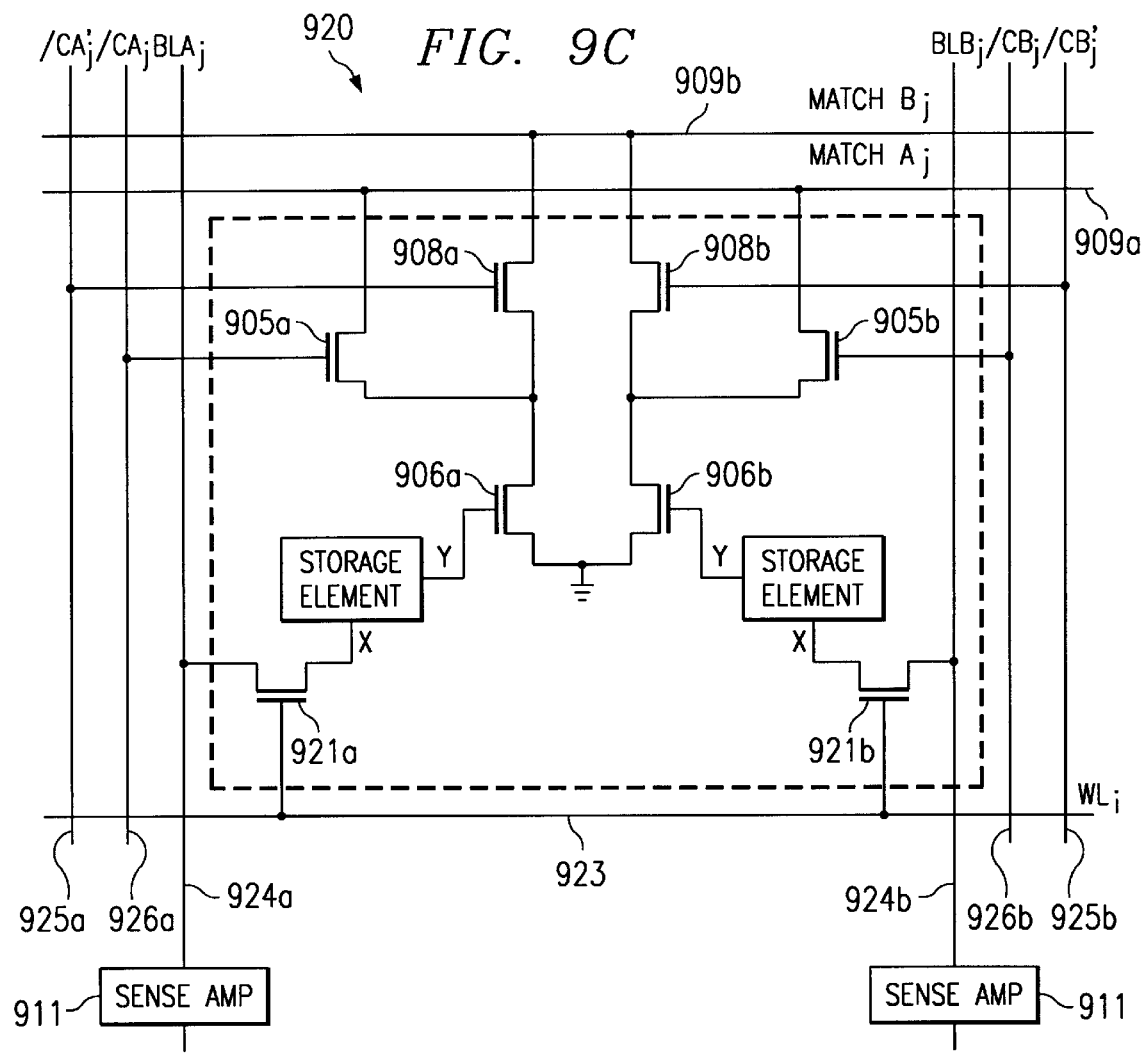
FIG. 9C illustrates a CAM cell utilizing both multiple comparelines and multiple independent matchlines.

FIG. 9C depicts an alternate embodiment of a CAM cell using multiple matchlines. In this case, the bitlines and comparelines are separate structures and the memory cells are based on a single transistor and a storage element. The operation of this cell is similar to that described above for the embodiment of FIGS. 9A and 9B.

Specifically, FIG. 9C illustrates a CAM cell 920 based on a pair of memory cells each comprising a pass transistor 921 and a storage element 922. As described above, the storage element may be a capacitor, volatile memory cell, or similar storage device. The pass transistors for the cells along Row i are controlled by a single wordline WLi 923. The cells along Column j are accessed through dedicated bitlines BLA$_j$ and BLB$_j$ (924a and 924b). The compareline pairs are now /CA$_j$' and /CB$_j$' (925a and 925b) and /CA$_j$ and /CB$_j$ (926a and 926b). In alternate embodiments, additional comparelines and matchlines can be added to the structure in FIG. 9C to allow additional comparisons to be made with the data stored in the pair of memory cells.

Figure 10:
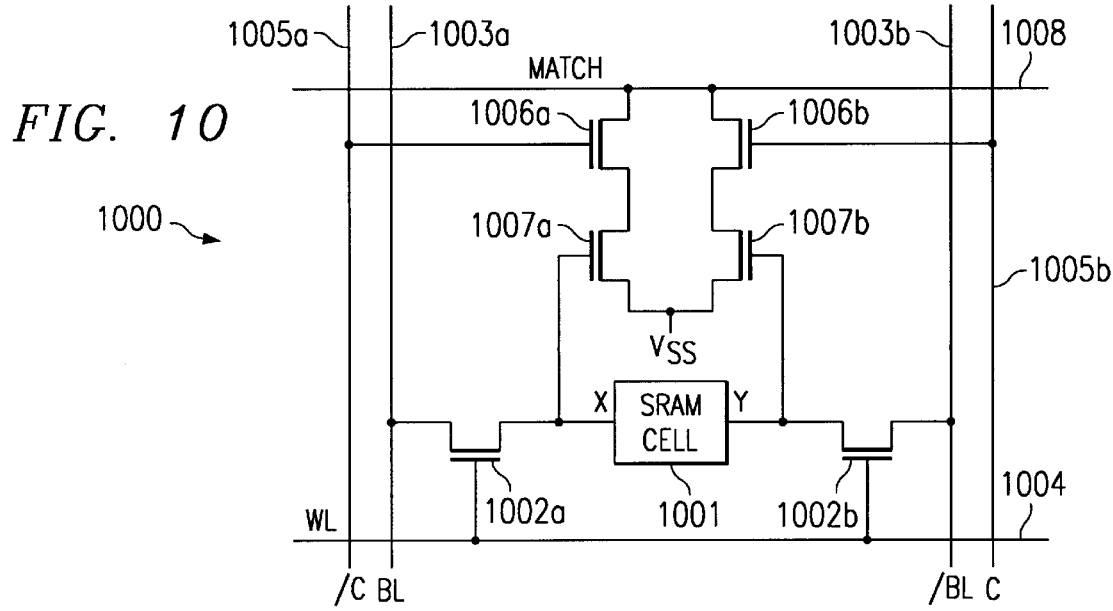
FIG. 10 illustrates a binary CAM cell based on an SRAM cell.

As a final example, FIG. 10 illustrates a binary CAM cell 1000 based on an SRAM cell 1001. SRAM cell 1001 may be, for example, one of the SRAM cells depicted in FIGS. 7B and 7D, with nodes X and Y corresponding between drawings.

Data is read from or written to cell 1001 through a pair of transistors 1002a and 1002b through a corresponding pair of bitlines 1003a and 1003b (BL and /BL respectively), under the control of a voltage asserted on wordline (WL) 1004.

Comparisons are effectuated through a pair of comparelines 1005a and 1005b and a XNOR gate comprised of transistors 1006a, 1006b, and 1007a, 1007b. The results of a match or no match are represented by the voltage on matchline 1008.

The decoding for comparison operations are provided in TABLE 5.

TABLE 5

| /C | C | Storage Element (Node X) | MATCHLINE |
|---|---|---|---|
| 0 | 0 | 0 | Float (Masked) |
| 0 | 0 | 1 | Float (Masked) |
| 0 | 1 | 0 | GND (No Match) |
| 0 | 1 | 1 | Float (Match) |
| 1 | 0 | 1 | GND (No Match) |
| 1 | 0 | 0 | Float (Match) |

In sum, the principles of the present invention allow for the construction of high performance CAMs, which are particularly useful in applications such as the translation tables used in telecommunications applications. The multiple matchline embodiments provide for the simultaneous interleaved performance of multiple comparisons. Those embodiments employing dedicated comparelines provide for the update of the search base while comparisons to that search base are simultaneously, interleaved or asynchronously being performed.

In addition to the simultaneous compare and update as previously described (in which the comparelines can be activated while the data is being restored) another mode is allowed which can make data access and compare functions take place independently. This case assumes that it is not critical that a row being read from, written to, or being refreshed, take part in a compare which may be taking place. Therefore, a simple circuit can be established that will automatically disable a matchline when the corresponding wordline is being accessed. This will remove that row from any compare functions and allow any activity to take place on the memory cells of that row. Once the need to change any data on that row is negated, the operation of the corresponding matchline can be restored.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed:

1. A telecommunications subsystem comprising:
    an input port for receiving a stream of information;
    a plurality of output ports, a selected one of said output ports transmitting said stream of information received by said input port to a next node in a telecommunications network; and
    a content addressable memory for storing a translation table, said translation table containing information for selecting said selected one of said output ports, comprising:
        a plurality of conductors;
        a plurality of memory cells each having a first transistor for exchanging charge between a first one of said conductors and a storage element and a second transistor for exchanging charge between said storage element and a second one of said conductors; and
        a comparator circuitry for comparing data presented on a selected pair of said plurality of conductors with data stored on said storage elements of a corresponding pair of said memory cells and selectively pulling-down a voltage on an associated matchline.

2. The telecommunications subsystem of claim 1 wherein said comparator circuitry compares data presented on a selected pair of dedicated comparelines.

3. The telecommunications subsystem of claim 1 wherein said first and second ones of said conductors comprise dual bitline-comparelines and said comparator circuitry compares data presented on a selected pair of said dual bitline-comparelines.

4. The telecommunications subsystem of claim 1 wherein said comparator circuitry is further operable to compare data presented on a second pair of said plurality of conductors with data stored on said storage capacitors of said pair of dynamic memory cells and selectively pull-down a second matchline in response.

5. The telecommunications subsystem of claim 1 wherein said translation table forms part of a telecommunications switch.

6. The telecommunications subsystem of claim 1 wherein said translation table forms part of a router.

* * * * *